(12) United States Patent
Then et al.

(10) Patent No.: US 9,837,499 B2
(45) Date of Patent: Dec. 5, 2017

(54) SELF-ALIGNED GATE LAST III-N TRANSISTORS

(71) Applicant: Intel Corporation, Santa Clara, CA (US)

(72) Inventors: Han Wui Then, Portland, OR (US); Sansaptak Dasgupta, Hillsboro, OR (US); Seung Hoon Sung, Portland, OR (US); Sanaz Gardner, Hillsboro, OR (US); Marko Radosavljevic, Beaverton, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/326,022

(22) PCT Filed: Aug. 13, 2014

(86) PCT No.: PCT/US2014/050826
§ 371 (c)(1),
(2) Date: Jan. 12, 2017

(87) PCT Pub. No.: WO2016/024960
PCT Pub. Date: Feb. 18, 2016

(65) Prior Publication Data
US 2017/0207310 A1    Jul. 20, 2017

(51) Int. Cl.
*H01L 29/15*  (2006.01)
*H01L 29/417* (2006.01)
(Continued)

(52) U.S. Cl.
CPC .... *H01L 29/41783* (2013.01); *H01L 29/2003* (2013.01); *H01L 29/205* (2013.01);
(Continued)

(58) Field of Classification Search
CPC .......... H01L 29/41783; H01L 29/2003; H01L 29/205; H01L 29/401; H01L 29/66462; H01L 29/7787
See application file for complete search history.

(56) References Cited

U.S. PATENT DOCUMENTS 7,259,049 B2    8/2007   Chan et al.
8,039,901 B2 *  10/2011  Matsumoto ....... H01L 21/82380
                                                          257/369
(Continued)

FOREIGN PATENT DOCUMENTS

EP    1726043    11/2013

OTHER PUBLICATIONS

International Search Report & Written Opinion dated May 14, 2015 for PCT Patent Application No. PCT/US2014/050826, 13 pages.

*Primary Examiner* — Victor A Mandala
*Assistant Examiner* — Colleen E Snow
(74) *Attorney, Agent, or Firm* — Green, Howard & Mughal LLP

(57) ABSTRACT

Techniques related to III-N transistors having self aligned gates, systems incorporating such transistors, and methods for forming them are discussed. Such transistors include a polarization layer between a raised source and a raised drain, a gate between the source and drain and over the polarization layer, and lateral epitaxial overgrowths over the source and drain and having and opening therebetween such that at least a portion of the gate adjacent to the polarization layer is aligned with the opening.

25 Claims, 8 Drawing Sheets

(51) Int. Cl.
*H01L 29/20* (2006.01)
*H01L 29/205* (2006.01)
*H01L 29/778* (2006.01)
*H01L 29/40* (2006.01)
*H01L 29/66* (2006.01)

(52) U.S. Cl.
CPC ...... *H01L 29/401* (2013.01); *H01L 29/66462* (2013.01); *H01L 29/7787* (2013.01)

(56) References Cited

U.S. PATENT DOCUMENTS

| | | |
|---|---|---|
| 2005/0199882 A1* | 9/2005 | Sankin .............. H01L 29/42316 257/77 |
| 2007/0293015 A1 | 12/2007 | Beach et al. |
| 2010/0330754 A1 | 12/2010 | Hebert |
| 2013/0320350 A1 | 12/2013 | Haberlen et al. |

* cited by examiner

SELF-ALIGNED GATE LAST III-N TRANSISTORS

CLAIM OF PRIORITY

This application is a National Stage Entry of, and claims priority to, PCT Application No. PCT/US14/50826, filed on 13 Aug. 2014 and titled "SELF-ALIGNED GATE LAST III-N TRANSISTORS", which is incorporated by reference in its entirety for all purposes.

TECHNICAL FIELD

Embodiments of the invention generally relate to III-N semiconductor transistors and, more particularly, relate to III-N transistors with self aligned gates, devices, and manufacturing techniques.

BACKGROUND

In some implementations, III-N material based transistors, such as gallium nitride (GaN) based transistors may be used for high voltage and/or high frequency applications. For example, power management integrated circuits (PMIC) and radio frequency integrated circuits (RFIC) may be critical functional blocks in system on a chip (SoC) implementations. Such SoC implementations may be found in mobile computing platforms such as smartphones, tablets, laptops, netbooks, and the like. In such implementations, the PMIC and RFIC are important factors for power efficiency and form factor (and can be as or more important than logic and memory circuits).

Gallium nitride based devices may be advantageous in some examples because GaN has a wide band gap (~3.4 eV) as compared to silicon (Si; ~1.1 eV). The wide band gap may allow a GaN transistor to withstand a larger electric field (e.g., applied voltage, $V_{DD}$) before suffering breakdown as compared to Si transistors of similar dimensions. Furthermore, GaN transistors may employ a 2D electron gas (e.g., 2D sheet charge) as its transport channel. For example, the 2D sheet charge may be formed at an abrupt hetero-interface formed by epitaxial deposition of a charge-inducing film with larger spontaneous and piezoelectric polarization such as aluminum nitride (AlN), aluminum gallium nitride (AlGaN) or aluminum indium nitride (AlInN) on GaN. Very high charge densities of up to $2\times10^{13}$ per $cm^2$ may be formed by such a mechanism without impurity dopants, allowing high mobilities of, for example, greater than 1000 $cm^2/(Vs)$.

For power management and radio frequency (RF) amplification, transistors may require large widths (e.g., greater than 1 mm) to deliver large currents (e.g., greater than 1 A) and large power (e.g., >1 W). Furthermore, to take full advantage of the discussed properties of GaN, the GaN transistors are typically heterogeneously integrated onto a Si substrate such that the GaN transistors may be placed in close proximity to Si CMOS devices. Such placement may minimize interconnect losses, provide for a smaller overall footprint, and provide scaling advantages.

In some current implementations, gate misalignments are prevalent. Such gate misalignments may include gate recess being misaligned with respect to raised sources and drains and gate electrodes being misaligned with respect to gate recesses, raised sources and drains, or both. Such misalignments may result in mistargeted device breakdown voltage or device failure.

As such, existing techniques do not provide for transistors having aligned gates and/or gate recesses. Such problems may become critical in PMIC or RFIC implementations, for large voltage handling (e.g., direct battery connect, input/output, universal serial bus), or the like.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
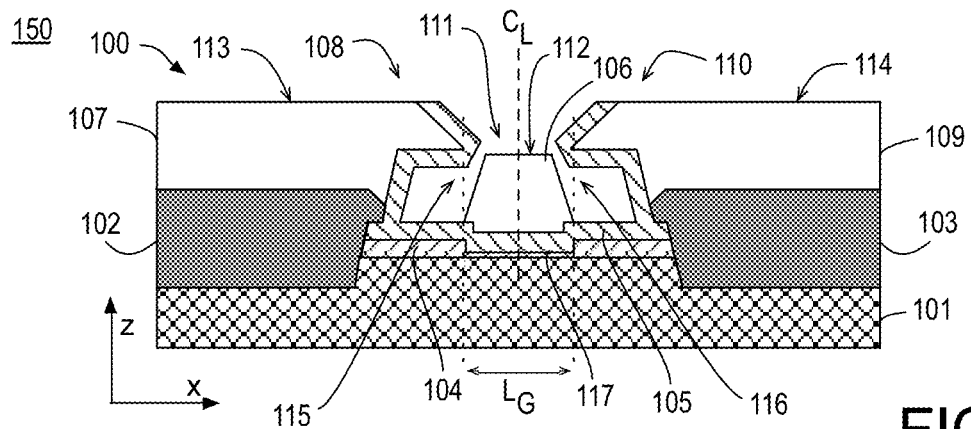
FIGS. 1, 2, and 3 are a side views of example transistor structures including example transistors with self aligned gates.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistors, devices, apparatuses, computing platforms, and methods are described below related to transistors having self aligned gates.

As described above, it may be advantageous to reduce gate misalignments that may cause mistargeted device breakdown voltage or device failure. In one embodiment as described herein, a gallium nitride (GaN) transistor may include a self-aligned gate. For example, the self-aligned gate may be aligned to an opening of a spacer structure including lateral epitaxy overgrowths having the opening therebetween. The lateral epitaxy overgrowths may be formed over a raised source and a raised drain such that they extend toward each other but, as discussed, have an opening therebetween. In some examples, the lateral epitaxy overgrowths may be formed over a sacrificial patterned hard-mask. The opening between the lateral epitaxy overgrowths may be used to align an optional gate recess in a polarization layer between the raised source and raised drain and/or to align the gate. As is discussed further herein, the polarization layer may be disposed over a device layer and may cause a 2D electron gas in the device layer as a transport channel. The gate or at least a portion of the gate adjacent to the polarization layer may be aligned to the opening and, in some examples, the gate or at least the portion of the gate may have a width not greater than a width of the opening.

In some examples, the gate may be formed such that a top of the gate is below the top surfaces of the lateral epitaxy overgrowths and such that gaps are formed between the gate and the lateral epitaxy overgrowths. Such a gap may reduce or eliminate parasitic gate leakage (e.g., leakage from the gate to the source or drain). In other examples, the gate may be formed such that a top of the gate extends above (e.g., vertically) and over (e.g., laterally) the tops of the lateral epitaxy overgrowths. In such examples, the material of the lateral epitaxy overgrowths may provide for reduced or eliminated parasitic gate leakage. For example, the material of the lateral epitaxy overgrowth, whether or not gaps are provided, may include a wide band gap semiconductor material such as gallium nitride or aluminum gallium nitride or the like. Such materials may reduce or eliminate parasitic gate leakage for example. As used herein, a semiconductor material may be any material having an electrical conductivity between that of a conductor and that of an insulator and a wide band gap material may be any material having a band gap that is wide as compared to silicon (~1.1 eV). For example, wide band gap materials may have a band gap greater than 2 eV. Such elimination of parasitic gate leakage may provide for high voltage operation of the transistors discussed herein. Furthermore, in some examples, a gate dielectric may be disposed between the polarization layer and the portion of the gate adjacent to the polarization layer. In some examples, the gate dielectric may extend over the polarization layer and the lateral epitaxial overgrowths or portions thereof. These embodiments are discussed further herein with respect to FIGS. 1, 2, and 3.

Figure 2:
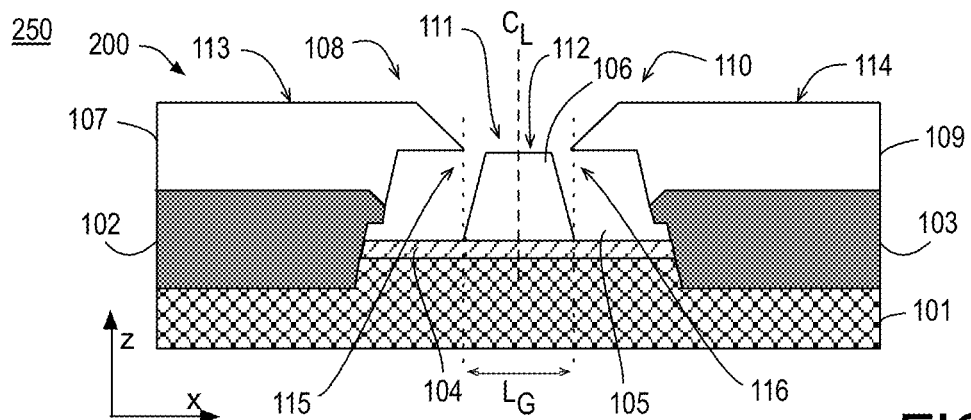
Figure 3:
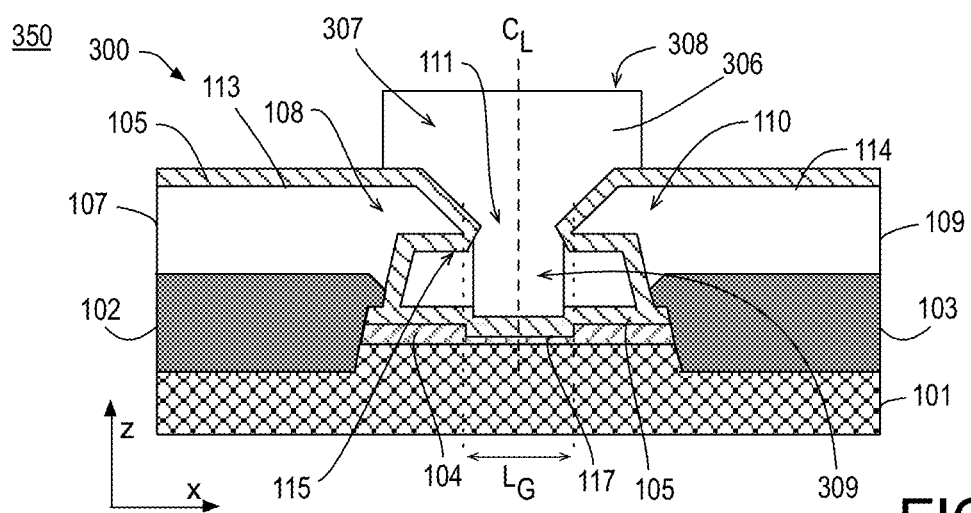

FIG. 1 is a cross-sectional (side) view of an example transistor structure 150 including an example transistor 100, arranged in accordance with at least some implementations of the present disclosure. As shown in FIG. 1, transistor structure 150 may include a device layer 101, a polarization layer 104 having a gate recess 117, a gate dielectric 105, a raised source 102, a raised drain 103, a gate 106, a lateral epitaxy overgrowth 107 and a lateral epitaxy overgrowth 109. As shown, an opening 111 may be provided between a portion 108 of lateral epitaxy overgrowth 107, and a portion 110 of lateral epitaxy overgrowth 109. In some examples, opening 111 may be between portions of gate dielectric 105 covering portions 108, 109 of lateral epitaxy overgrowths 107, 109 as shown. In other examples, gate dielectric may not cover portions 108, 109 of lateral epitaxy overgrowths 107, 109 as illustrated with respect to FIG. 2. In some examples, gate recess 117 and/or gate 106 may be aligned with opening 111. As used herein, the term aligned is used to indicate the described elements are substantially arranged along a line (e.g., typically a vertical line). For example, the vertical direction as used herein may be in the z-direction as shown in FIGS. 1-3. For example, gate recess 117 and opening 111 may be aligned such that they are substantially aligned along centerline, $C_L$, as shown in FIG. 1. In some examples, the described elements may have further characteristics beyond being aligned. For example, a width of gate recess 117 and a width of opening 111 may be substantially the same or gate recess 117 may have a width that is not more than the width of opening 111 or the like. However, such geometries are not needed for elements to be aligned as discussed herein.

Continuing with FIG. 1, as shown, transistor structure 150 may include device layer 101. Device layer 101 may include, for example, a III-N material such as an epitaxial III-N material. Device layer 101 may include any suitable material such as gallium nitride (GaN) and device layer 101 may be formed on any suitable substrate (not shown). Furthermore, transistor structure 150 may include polarization layer 104. Polarization layer 104 may include any material, materials, or material stack that may provide a 2D electron gas (not shown) in device layer 101. For example, polarization layer 104 may be aluminum nitride (AlN), aluminum indium nitride (AlInN), or aluminum gallium nitride (AlGaN), or any combination thereof. For example, polarization layer 104, due to the polarization difference between device layer 101 (e.g., the epitaxial III-N material of device layer 101) and polarization layer 104, may provide for the formation of a high charge density and high mobility 2D electron gas in device layer 101. In some examples, a channel (not shown) may be formed in device layer 101 substantially under gate 106 during the operation of transistor 100.

As shown in FIG. 1, polarization layer 104 may include a gate recess 117. Gate recess 117 may be aligned with opening 111. For example, gate recess 117 and opening 111 may be aligned along centerline $C_L$ as shown. For example, lateral epitaxy overgrowth 107 and lateral epitaxy overgrowth 109 may be symmetrical or substantially symmetrical with respect to a centerline of gate 106 and/or a centerline of gate recess 117. In some embodiments, lateral epitaxy overgrowth 107 and lateral epitaxy overgrowth 109 may provide a symmetric mask for the formation of gate 106 and/or gate recess 117. Furthermore, gate recess 117 may have a width or length, $L_G$, that is substantially the same as the width of opening 111 (e.g., the opening between portions 108, 110 of lateral epitaxy overgrowths 107, 109). In some examples, gate recess 117 may have a width that is not greater than a width of opening 111. In some examples, length $L_G$ may define a gate length of transistor 100. Gate recess 117 may have substantially any depth within polarization layer 104. For example, gate recess 117 may have a depth of approximately half of the depth of polarization layer 104 or the like. In some examples, gate recess 117 (e.g., the depth of gate recess 117) may be used to tune a threshold voltage, $V_T$, of transistor 100. Furthermore, transistor 100 may include gate dielectric 105. Gate dielectric 105 may include any suitable material or materials such as a high-k dielectric material. For example, gate dielectric 105 may include a high-k dielectric material and gate 106 may be a metal gate such that transistor 100 may be characterized as a high-k metal gate transistor. In some examples, as discussed with respect to FIG. 2, no gate recess and/or no gate dielectric material may be implemented. For example, transistors that include gate dielectric 105 may be characterized as field effect transistors (FETs) and transistors that do not include gate dielectric 105 may be characterized as high-electron-mobility transistors (HEMTs).

Also as shown in FIG. 1, transistor 100 may include raised source 102 and raised drain 103. As shown, raised source 102 and raised drain 103 may be disposed within trenches of device layer 101. Also as shown, raised source 102 and raised drain 103 may be disposed such that polarization layer 104 is between raised source 102 and raised drain 103. Raised source 102 and raised drain 103 may include any suitable material or materials that may provide a current source and current drain for transistor 100 and that may provide for epitaxial growth of lateral epitaxy overgrowth 107, 109. In some examples, raised source 102 and raised drain 103 may include an epitaxial material or material. In some examples, source 102 and raised drain 103 may include indium gallium nitride such as an N+ indium gallium nitride. Although illustrated herein with raised source 102 and raised drain 103, in some examples, planar source and drain structures may be used.

Continuing with FIG. 1, transistor structure 150 may include lateral epitaxy overgrowths 107, 109. As shown, lateral epitaxy overgrowth 107 may be disposed over raised source 102 and lateral epitaxy overgrowth 107 may have a portion 108 that extends laterally toward gate 106. As used herein, the term laterally indicates a direction that is horizontal or substantially horizontal. For example, the horizontal direction as used herein may be in the x-direction as shown in FIGS. 1-3. Similarly, lateral epitaxy overgrowth 109 may be disposed over raised drain 104 and lateral epitaxy overgrowth 109 may have a portion 110 that extends laterally toward gate 106. As shown, lateral epitaxy overgrowth 107 and lateral epitaxy overgrowth 109 may have opening 111 between portions 108 and 110. As discussed, gate recess 117 and/or gate 106 may be aligned with opening 111.

For example, lateral epitaxy overgrowths 107, 109 may provide for spacer structures for the alignment of gate recess 117 and/or gate 106 along a line or plane between the opening of the spacer structure. In some examples, such aligned gate recess 117 and/or gate 106 may be formed after the formation of lateral epitaxy overgrowths 107, 109. In such examples, transistor 100 may be characterized as a self-aligned gate last transistor such that gate 106 is self-aligned to lateral epitaxy overgrowths 107, 109 and such that gate 106 is formed after lateral epitaxy overgrowths 107, 109. Lateral epitaxy overgrowths 107, 109 may be any suitable material or materials that may provide for opening 111 and, in some examples, electrical isolation between gate 106 and raised source 102 and between gate 106 an raised drain 104. In some embodiments, lateral epitaxy overgrowths 107, 109 may include gallium nitride or aluminum gallium nitride or the like. In an embodiment, lateral epitaxy overgrowths 107, 109 include undoped gallium nitride. In another embodiment, lateral epitaxy overgrowths 107, 109 include undoped aluminum gallium nitride ($Al_xGa_{1-x}N$) such that the percentage of aluminum is about 10% (i.e., x=0.1) with a balance of gallium (e.g., $Al_{0.1}Ga_{0.9}N$). Gate 106 may have any suitable conductive material. As discussed, in some examples, gate 106 may include a metal as discussed herein.

As shown in FIG. 1, in some examples, a top 112 of gate 106 may be below a top 113 of lateral epitaxy overgrowth 107 and a top 114 of lateral epitaxy overgrowth 109. In some examples, top 112 of gate 106 may also be below bottom surfaces (not labeled) of portion 108 of lateral epitaxy overgrowth 107 and potion 110 of lateral epitaxy overgrowth 109 as shown. Furthermore, in some examples, a gap 115 may be provided between gate 106 and lateral epitaxy overgrowth 107 and a gap 116 may be provided between gate 106 and lateral epitaxy overgrowth 109. In some examples, gaps 115, 116 may be filled with an insulating dielectric such as silicon oxide ($SiO_2$) or silicon nitride (SiN) or the like. In examples including gaps 115, 116, gaps 115 116 may provide isolation such that any parasitic gate leakage (e.g., leakage from gate 106 to raised source 102 or from gate 106 to raised drain 104) may be reduced or eliminated. In examples where gaps 115, 116 are not provided (e.g., examples where portion 108 of lateral epitaxy overgrowth 107 and/or portion 110 of lateral epitaxy overgrowth 109 are in contact with gate 106), the material of lateral epitaxy overgrowths 107, 109 may be chosen to reduce or eliminate such parasitic gate leakage. For example, as discussed, lateral epitaxy overgrowths 107, 109 may include a wide band gap semiconductor material such as GaN or $Al_xGa_{1-x}N$ to reduce or eliminate parasitic gate leakage. Furthermore, in some examples, as shown, gate dielectric 105 may provide a conformal insulating dielectric between gate 106 and lateral epitaxy overgrowths 107, 109. Such a gate dielectric may be deposited using any technique discussed herein with atomic layer deposition being particularly advantageous. Such a configuration of gate dielectric 105 may provide the needed isolation to prevent gate leakage and/or provide additional isolation.

FIG. 2 is a cross-sectional (side) view of an example transistor structure 250 including an example transistor 200, arranged in accordance with at least some implementations of the present disclosure. As shown in FIG. 2, transistor structure 250 may include device layer 101, polarization layer 104, raised source 102, raised drain 103, gate 106, lateral epitaxy overgrowth 107, and lateral epitaxy overgrowth 109. Furthermore, opening 111 may be provided between portion 108 of lateral epitaxy overgrowth 107 and portion 110 of lateral epitaxy overgrowth 109 as discussed with respect to FIG. 1 herein. As discussed, gate 106 may be may be aligned with opening 111.

In the example of FIG. 2, transistor 200 may not include a gate dielectric. In such examples, transistor 200 may be characterized as high-electron-mobility transistor (HEMT). Such HEMTs may offer advantages such as excellent performance at high voltage and high frequencies. Also as shown in FIG. 2, transistor 200 may not include a gate recess. Such exclusion of a gate recess may offer simplicity in fabrication for example. Although transistors are illustrated with a gate recess and gate dielectric (e.g., in FIG. 1) and without a gate recess and without a gate dielectric (e.g., in FIG. 2), other combinations are available. For example, transistors may be formed with a gate dielectric but without a gate recess or with a gate recess but without a gate dielectric. Furthermore, the illustrated elements of transistor structure 250 such as device layer 101, polarization layer 104, raised source 102, raised drain 103, gate 106, lateral epitaxy overgrowth 107, and lateral epitaxy overgrowth 109 may include any materials or other characteristics as discussed with respect to transistor structure 150 and such details will not be repeated for the sake of brevity and clarity of presentation.

FIG. 3 is a cross-sectional (side) view of an example transistor structure 350 including an example transistor 300, arranged in accordance with at least some implementations of the present disclosure. As shown in FIG. 1, transistor structure 150 may include device layer 101, polarization layer 104 having gate recess 117, gate dielectric 105, raised source 102, raised drain 103, a gate 306, lateral epitaxy overgrowth 107 and lateral epitaxy overgrowth 109. As shown, opening 111 may be provided between a portion 108 of lateral epitaxy overgrowth 107, and a portion 110 of lateral epitaxy overgrowth 109. In some examples, gate recess 117 and/or gate 306 may be aligned with opening 111.

As shown, in the example of FIG. 3, transistor 300 may include gate 306 such that gate 306 has a portion 307 that extends above (e.g., vertically above) top 113 of lateral epitaxy overgrowth 107 and above top 114 of lateral epitaxy overgrowth 109. Furthermore, as shown, portion 307 may extend over (e.g., laterally over) portion 108 of lateral epitaxy overgrowth 107 or at least part of portion 108 and over portion 110 of lateral epitaxy overgrowth 109 or at least part of portion 110. As shown, gate 306 may have a top 308 that extends above top 113 of lateral epitaxy overgrowth 107 and above top 114 of lateral epitaxy overgrowth 109. As shown, gate 306 transistor structure 350 may have a substantially T-shape in cross section. As discussed with respect to gate 106, gate 306 may be aligned with opening 111. In particular, a portion 309 of gate 306 may be self aligned via opening 111 as discussed. For example, portion 309 of gate 306 may be aligned with opening 111. In some examples, portion 307 of gate 306 may be formed via patterning a bulk material deposition or via a lift off technique as is discussed further herein with respect to FIG. 5K. In such examples, portion 307 of gate 306 may be patterned and therefore not self aligned to opening 111. However, portion 309 of gate 306 may be self aligned to opening 111 via the constraints applied by lateral epitaxy overgrowths 107, 109.

Figure 5A:
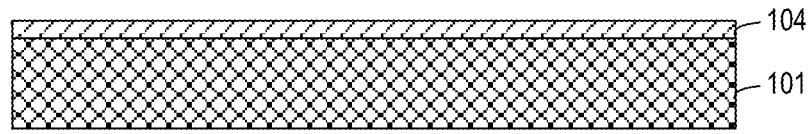
FIGS. 5A, 5B, 5C, 5D, 5E, 5F, 5G, 5H, 5I, 5J, and 5K are side views of example transistor structures as particular fabrication operations are performed.
Figure 5B:
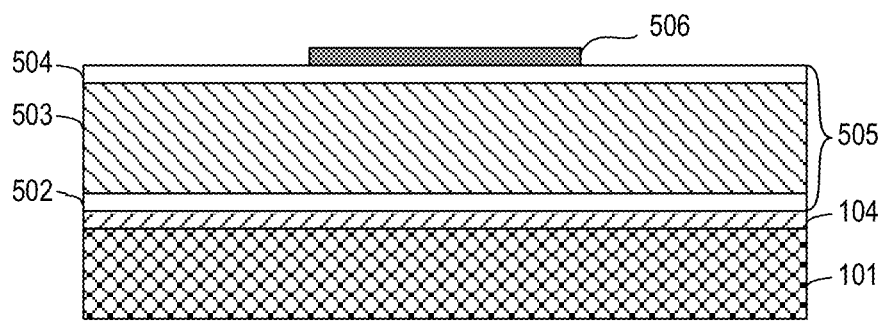
Figure 5C:
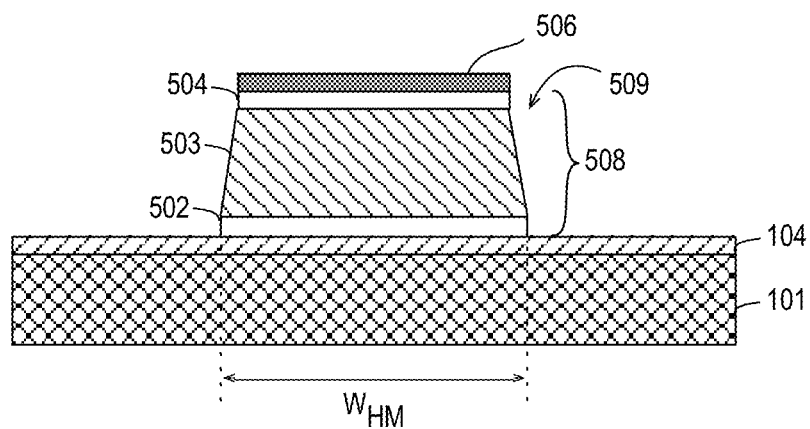
Figure 5D:
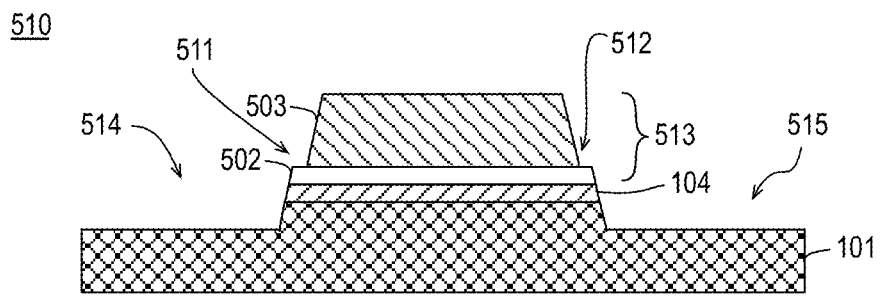
Figure 5E:
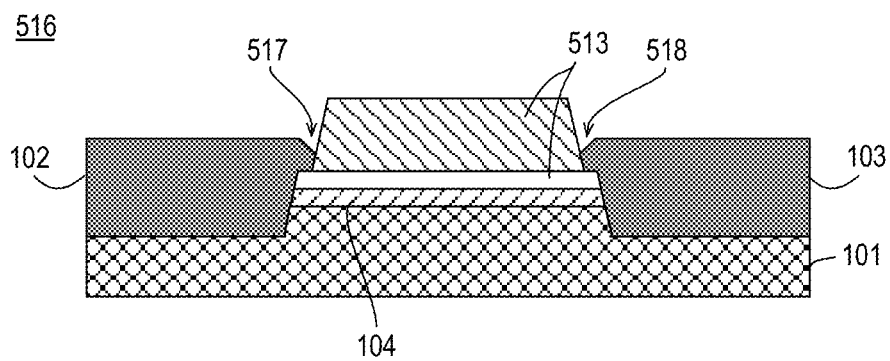
Figure 5F:
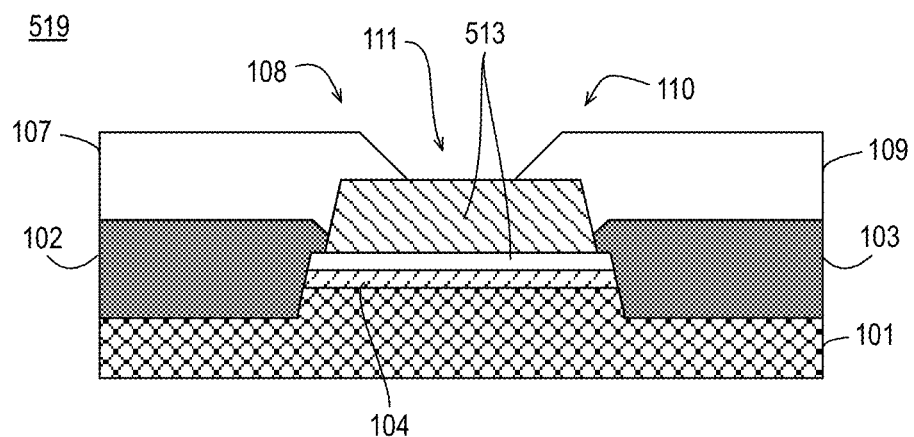
Figure 5G:
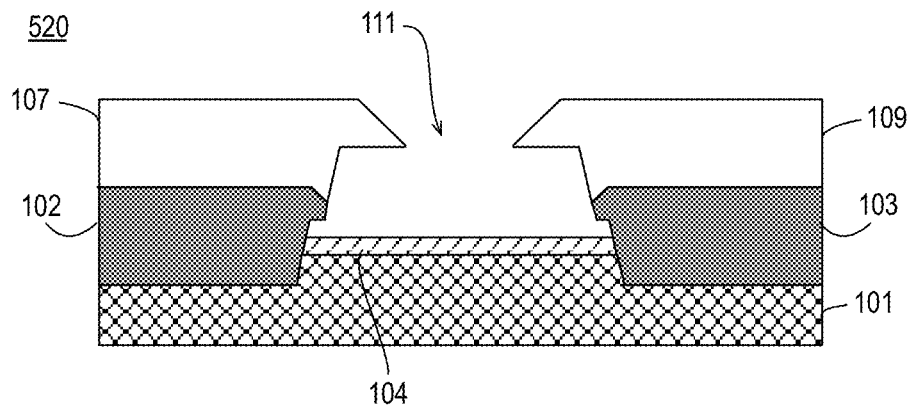
Figure 5H:
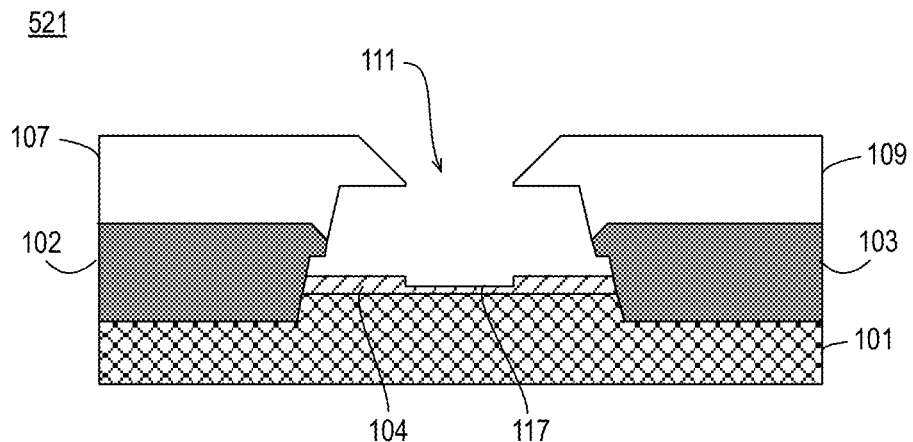
Figure 5I:
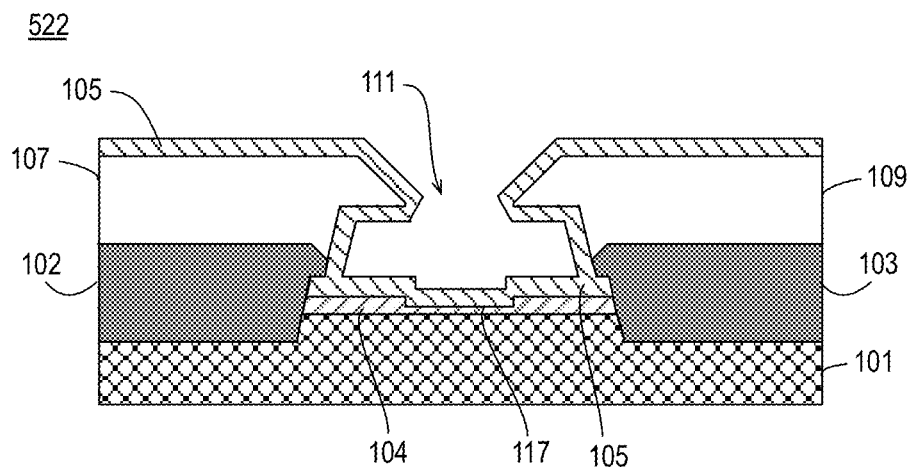
Figure 5J:
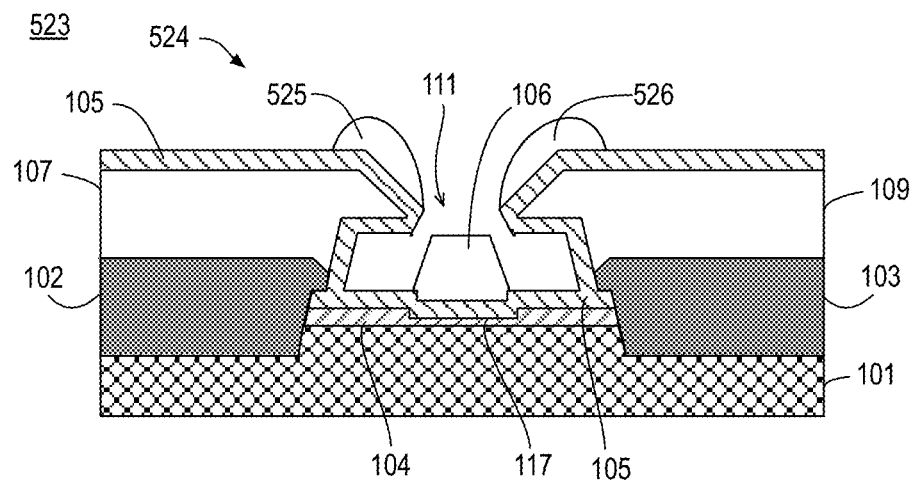

Additional details associated with the described features of transistor structures 150, 250, 350 and/or transistors 100, 200, 300 are provided herein with respect to FIGS. 5A-5K, which discuss the formation of transistor structures 150, 250, 350 and/or transistors 100, 200, 300 as well as the formation of transistor structure 523 and transistor 524 as is discussed with respect to FIG. 5J.

Furthermore, transistor structures 150, 250, 350, 523 and/or transistors 100, 200, 300, 524 may be implemented in an electronic device structure comprising a system on a chip. For example, the structure may include a silicon Complementary Metal Oxide Semiconductor (CMOS) circuit portion, a III-N material based device portion, and/or other device portions, implemented on a substrate. The III-N material based devices (e.g., any, some or all of transistors 100, 200, 300, 524) may be formed on III-N material regions that are formed on, over, or within the substrate. For example, the substrate may be silicon as discussed herein. The III-N material regions may be formed adjacent to CMOS circuit portions based on device requirements for example.

Although illustrated with respect to structures having lateral and/or planar channels, the techniques discussed herein may be extended to vertically oriented MOSFET devices, tunnel field effect transistors (TFET), or the like. Such implementations may have the advantage of additional channel capacity using similar device geometries for example.

Figure 4:
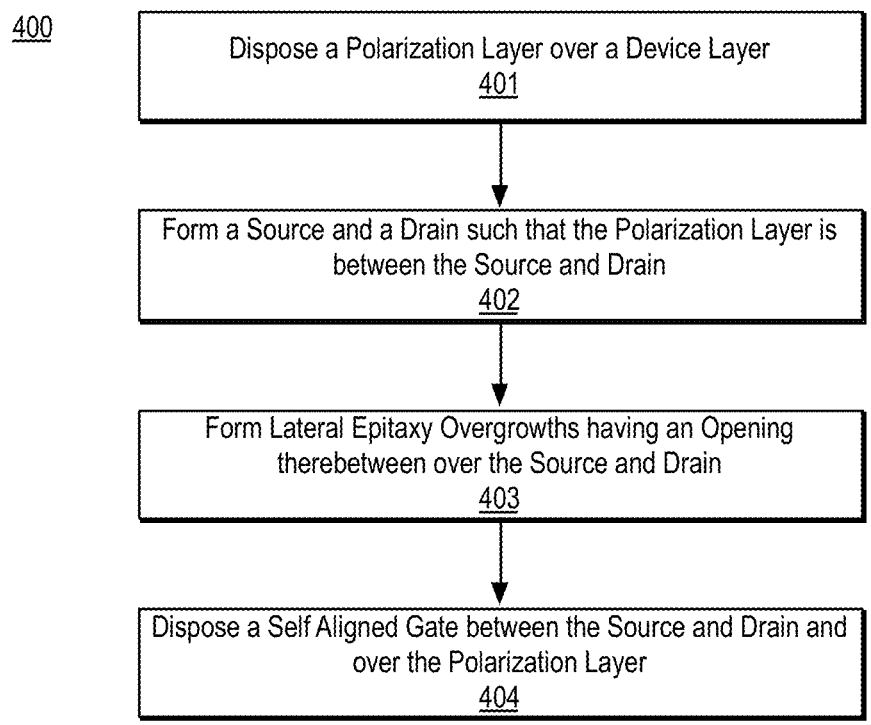
FIG. 4 is a flow diagram illustrating an example process for forming a transistor having a self aligned gate.

FIG. 4 is a flow diagram illustrating an exemplary process 400 for forming a transistor having a self aligned gate, arranged in accordance with at least some implementations of the present disclosure. For example, process 400 may be implemented to fabricate any of transistors 100, 200, 300, 524 as discussed herein. In the illustrated implementation, process 400 may include one or more operations as illustrated by operations 401-404. However, embodiments herein may include additional operations, certain operations being omitted, or operations being performed out of the order provided.

Process 400 may begin at operation 401, "Dispose a Polarization Layer over a Device Layer", where a polarization layer may be disposed over a device layer. In an embodiment, polarization layer 104 may be formed over device layer 101 as is discussed further with respect to FIG. 5A and elsewhere herein. In an embodiment, polarization layer 104 may include aluminum indium nitride and device layer 101 may include gallium nitride.

Process 400 may continue at operation 402, "Form a Source and a Drain such that the Polarization Layer is between the Source and Drain", where a source and a drain may be formed such that the polarization layer is between the source and drain. In an embodiment, a raised source such as raised source 102 and a raised drain such as raised drain 104 may be formed with trenches of device layer 101 as is discussed further herein with respect to FIGS. 5B-5E and elsewhere herein. In an embodiment, raised source 102 and raised drain 104 may include N+ indium gallium nitride.

Process 400 may continue at operation 403, "Form Lateral Epitaxy Overgrowths having an Opening therebetween over the Source and Drain", where lateral epitaxy overgrowths may be formed over the source and the drain. For example, a first lateral epitaxy overgrowth may be formed over the raised source and a second lateral epitaxy overgrowth may be formed over the raised drain such that the first and second lateral epitaxy overgrowths have an opening between a laterally extending first portion of the first lateral epitaxy overgrowth and laterally extending second portion of the second lateral epitaxy overgrowth as is discussed further herein with respect to FIGS. 5F-5H and elsewhere herein. In an embodiment, lateral epitaxy overgrowth 107 may be formed over raised source 102 and lateral epitaxy overgrowth 109 may be formed over raised source 104 such that opening 111 is provided between portion 108 of lateral epitaxy overgrowth 107 and portion 110 of lateral epitaxy overgrowth 109. In an embodiment, lateral epitaxy overgrowths 107, 109 may include undoped gallium nitride.

Process 400 may continue at operation 404, "Dispose a Self Aligned Gate between the Source and Drain and over the Polarization Layer", where a self aligned gate may be disposed between the source and drain and over the polarization layer. In an embodiment, gate 106 may be disposed between raised source 102 and raised drain 104 and over polarization layer 104 as is discussed further with respect to FIG. 5J and elsewhere herein. In an embodiment, gate 306 may be disposed between raised source 102 and raised drain 104 and over polarization layer 104 as is discussed further with respect to FIG. 5K and elsewhere herein. In some examples, at least a portion of the gate may be aligned with opening 111 (e.g., a centerline of the gate may be aligned with a centerline of opening 111). In an embodiment, gate 106 may be aligned with opening 111. In another embodiment, portion 309 of gate 306 may be aligned with opening 311.

As discussed, process 400 may be implanted to fabricate any of transistors 100, 200, 300, 524. Further details associated with such fabrication techniques are discussed herein an in particular, with respect to FIGS. 5A-5K. Any one or more of the operations of process 400 (or the operations discussed herein with respect to FIGS. 5A-5K) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

FIGS. 5A-5K are side views of example transistor structures as particular fabrication operations are performed, arranged in accordance with at least some implementations of the present disclosure. As shown in FIG. 5A, transistor structure 500 includes polarization layer 104 formed over a device layer 101. In some examples, device layer 101 may be disposed over a substrate (not shown). For example, the substrate may be a substrate substantially aligned along a predetermined crystal orientation (e.g., (100), (111), (110), or the like). In some examples, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 101 may include silicon having a (100) crystal orientation with a 4°-11° miscut (with 4°-6° being particularly advantageous). Examples using a silicon substrate having a crystal orientation of (110) may offer the advantage of having a smaller mismatch for subsequent epitaxial growth. In various examples, the substrate may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Device layer 101 may be formed using any suitable technique or techniques. For example, device layer 101 may be formed using any suitable epitaxial growth technique such as an epitaxial growth via chemical vapor deposition (CVD), metal organic chemical vapor deposition (MOCVD), atomic layer deposition (ALD), or any other epitaxial growth technique, with MOCVD being particularly advantageous. In some examples, the formation of device layer 101 may include defect trapping techniques. In some embodiments, devices may be formed in a defect free region of device layer 101 such as an island of material or the like. Furthermore, device layer 101 may include any suitable III-N material such as, for example, an epitaxial III-N material. In an embodiment, device layer 101 is gallium nitride. Device layer 101 may be any suitable thickness such as, for example, 100-500 nm or more.

Also as shown in FIG. 5A, polarization layer 104 may be formed over device layer 101. Polarization layer 104 may be formed using any suitable technique or techniques. In some examples, polarization layer 104 may be performed via an epitaxial growth technique such as an epitaxial growth via chemical vapor deposition, metal organic chemical vapor deposition, atomic layer deposition, or the like. Polarization layer 104 may include any material or material stacks that may provide a 2D electron gas in device layer 101. For example, polarization layer 104 may be aluminum nitride (AlN), aluminum indium nitride (AlInN), or aluminum gallium nitride (AlGaN), or any combination thereof. Polarization layer 104 may have any suitable thickness. In some examples, polarization layer 104 may have a thickness of 6 to 10 nm.

FIG. 5B illustrates a transistor structure 501 similar to transistor structure 500, after the formation of hardmask stack 505 and the formation of patterned layer 506. As shown, in some examples, hardmask stack 505 may include three layers including hardmask layer 502, hardmask layer 503, and hardmask layer 504. However, any number of hardmask layers may be used such as one, two, three, four, or more. Furthermore, hardmask stack 505 may include any suitable material or materials that will provide a mask for the subsequent formation of trenches or recesses in polarization layer 104 and device layer 101 and may be selective to the subsequently formed raised source 102 and raised drain 104 (e.g., epitaxial III-N materials) such as, for example, silicon oxide, silicon nitride, silicon oxynitride, aluminum oxide, or the like. In an embodiment, hardmask layer 502 is aluminum oxide (Al₂O₃), hardmask layer 503 is silicon nitride (SiN), and hardmask layer 504 is aluminum oxide. The layers of hardmask stack 505 may be formed using any suitable technique or techniques. For examples, hardmask layers 502-504 or the like may be deposited using a blanket deposition techniques such as chemical vapor deposition, plasma enhanced chemical vapor deposition, physical vapor deposition, molecular beam epitaxy, metalorganic chemical vapor deposition, atomic layer deposition, or the like.

Hardmask stack 505 may have any suitable thickness. In some examples, a thickness of hardmask stack 505 may be provided such that subsequent processing such as etch processing may reduce the size of hardmask stack 505 to a desired height for subsequent processing. For example, as is discussed further below, a patterned and post-etch hardmask may be used as a sacrificial layer for the formation of lateral epitaxy overgrowths 107, 109. In such examples, the thickness of hardmask stack 505 may be provided such that a thickness of the patterned and post-etch hardmask may be of a desired thickness for the formation of lateral epitaxy overgrowths 107, 109. In some examples, hardmask stack 505 may have a thickness of about 120 to 200 nm. In an embodiment, hardmask layer 502 has a thickness of about 10 nm, hardmask layer 503 has a thickness of about 120 nm, and hardmask layer 504 has a thickness of about 10 nm.

Patterned layer 506 may include any suitable material for patterning hardmask stack 505 such as a resist and patterned layer 506 may be formed using any suitable techniques such as photolithography techniques.

FIG. 5C illustrates a transistor structure 507 similar to transistor structure 501, after the patterning of hardmask stack 505 to form a patterned hardmask stack 508. As shown in FIG. 5C, in some examples, patterned hardmask stack 508 may have tapered sidewalls 509. Hardmask stack 505 may be patterned using any suitable technique or techniques to form patterned hardmask stack 508. In some examples, hardmask stack 508 patterned using etch processing. Patterned hardmask stack 508 may have any suitable width, $W_{HM}$, such as a width in the range of 120 to 300 nm.

FIG. 5D illustrates a transistor structure 510 similar to transistor structure 507, after the patterning of polarization layer 104 and device layer 101 to form trenches 514, 515 and to form sacrificial patterned hardmask 513. Polarization layer 104 and device layer 101 may be patterned to form trenches 514, 515 using any suitable technique or techniques. In some examples, trenches 514, 515 may be patterned using etch processing. For example, trenches 514, 515 may be formed by hardmask etching using patterned hardmask stack 508. Such etch processing may also erode patterned hardmask mask stack 508 to form sacrificial patterned hardmask 513. As shown, sacrificial patterned hardmask may include two remaining hardmask layers. In some examples, patterned layer 506 may also be consumed in such etch processing and, in other examples, patterned layer 506 may be removed prior to such etch processing via a dry etch process for example. As shown, in some examples, the etch processing may etch hardmask layer 503 more quickly than hardmask layer 502 such that notches 511, 512 may be formed. Sacrificial patterned hardmask 513 may have any suitable thickness such as a thickness of about 70 to 250 nm.

FIG. 5E illustrates a transistor structure 516 similar to transistor structure 510, after the formation of raised source 102 and raised drain 103. Raised source 102 and raised drain 103 may be formed using any suitable technique or technique. In some examples, raised source 102 and raised drain 103 may be formed via an epitaxial growth technique such as an epitaxial growth via chemical vapor deposition, metal organic chemical vapor deposition, atomic layer deposition, or the like. Raised source 102 and raised drain 103 may include any suitable material or materials. In some examples, raised source 102 and raised drain 103 include N+ materials. In some embodiments, raised source 102 and raised drain 103 include indium gallium nitride. Furthermore, raised source 102 and raised drain 103 may have any suitable thickness such as a thickness of about 100 nm. As shown, in some examples, raised source 102 may include a notch 517 and raised drain 103 may include a notch 518.

FIG. 5F illustrates a transistor structure 519 similar to transistor structure 516, after the formation of lateral epitaxy overgrowth 107 and lateral epitaxy overgrowth 109. Lateral epitaxy overgrowths 107, 109 may be formed using any suitable technique or technique. In some examples, lateral epitaxy overgrowths 107, 109 may be formed via an epitaxial growth technique such as an epitaxial growth via chemical vapor deposition, metal organic chemical vapor deposition, atomic layer deposition, or the like. Lateral epitaxy overgrowths 107, 109 may include any suitable material or materials. In some examples, lateral epitaxy overgrowths 107, 109 include a wide band gap semiconductor material such as undoped gallium nitride or aluminum gallium nitride. Lateral epitaxy overgrowths 107, 109 may have any suitable thickness that exceeds the top of sacrificial patterned hardmask 513, such as a thickness of about 100 nm. As shown in FIG. 5F, lateral epitaxy overgrowths 107, 109 may be epitaxially grown from raised source 102 and raised drain 103, respectively. Furthermore, lateral epitaxy overgrowth 107 may be grown over a part or portion of sacrificial patterned hardmask 513 and lateral epitaxy overgrowth 109 may be grown over another part or portion of sacrificial patterned hardmask 513 such that opening 111 is formed between lateral epitaxy overgrowths 107, 109. For example, lateral epitaxy overgrowth 107 and lateral epitaxy overgrowth 109 may have opening 111 between laterally extending portions 108, 110. Opening 111 may be formed using any suitable technique. For example, the epitaxial overgrowth of lateral epitaxy overgrowths 107, 109 may be timed or controlled via various process parameters to provide opening 111. Opening 111 may have any suitable width such as a width of 80 nm, a width of 100 nm, or a width of 120 nm or the like, as required by a predetermined channel length for example.

FIG. 5G illustrates a transistor structure 520 similar to transistor structure 519, after the removal of sacrificial patterned hardmask 513. Sacrificial patterned hardmask 513 may be removed using any suitable technique or techniques such as etch processing techniques. For example, an etch selective to the material or materials of sacrificial patterned hardmask 513 and not selective to the materials of lateral epitaxy overgrowths 107, 109, raised source 102, raised drain 103, and polarization layer 104 may be used to remove sacrificial patterned hardmask 513.

FIG. 5H illustrates a transistor structure 521 similar to transistor structure 520, after the formation of gate recess 117. Gate recess 117 may be formed using any suitable technique or techniques. For example, gate recess 117 may be formed via a directional etch using opening 111 between lateral epitaxy overgrowths 107, 109 as a self aligning mask. For example, the width of gate recess 117 may define the channel length of transistor structure 521 and the transistor fabricated as discussed herein. For example, as discussed with respect to FIG. 1, gate recess 117 may be aligned with opening 111. Furthermore, in some examples, gate recess 117 may have a width substantially the same as the width of opening 111. In some examples, a portion of lateral epitaxy overgrowths 107, 109 may be consumed during the formation of gate recess 117. In some examples, gate recess 117 may be used to tune a threshold voltage of a transistor. As discussed, in some embodiments, gate recess 117 may be provided. In other embodiments, such as embodiments discussed with respect to FIG. 2, no gate recess may be used.

FIG. 5I illustrates a transistor structure 522 similar to transistor structure 521, after the formation of gate dielectric 105. Gate dielectric 105 may include any suitable material or material stack. In some examples, gate dielectric 105 may include a high-k dielectric material or materials. Gate dielectric 105 may be formed using any suitable technique or techniques. For example, gate dielectric 105 may be deposited using a blanket deposition techniques such as chemical vapor deposition, plasma enhanced chemical vapor deposition, physical vapor deposition, molecular beam epitaxy, metalorganic chemical vapor deposition, atomic layer deposition, or the like, with atomic layer deposition being particularly advantageous. As shown, in some examples, gate dielectric 105 may cover exposed portions of lateral epitaxy overgrowths 107, 109, raised source 102, raised drain, and polarization layer 104. Furthermore, in some examples, gate dielectric 105 may remain over exposed portions of lateral epitaxy overgrowths 107, 109, raised source 102, raised drain, and polarization layer 104 as is shown with respect to FIGS. 5J and 5K. In other examples, portions of gate dielectric 105 may be removed to provide the structure as shown in FIG. 1. In other examples, portions of gate dielectric may be removed from a top surface of lateral epitaxy overgrowths 107, 109. As discussed, in some embodiments, gate dielectric may be provided. In such embodiments, the resultant transistor may be characterized as a field effect transistor (FET). In other embodiments, such as embodiments discussed with respect to FIG. 2, no gate dielectric may be used. In such embodiments, the resultant transistor may be characterized as a Schottky gate high-electron-mobility transistor (HEMT)

FIG. 5J illustrates a transistor structure 523 similar to transistor structure 522, after the formation of gate 106. Gate 106 may be formed using any suitable technique or techniques. In some examples, gate 106 may be a metal. For example, gate 106 may be formed via a deposition or sputter or the like. As discussed, in some examples, gate dielectric 105 may be a high-k material or materials and in such examples, the resultant transistor may be characterized as a high-k metal gate transistor. As shown, in some examples, the formation of gate 106 may also cause the formation of excess material 525 and excess material 526. Excess material 525 and excess material 526 may not encroach to region adjacent to gate 106 due to opening 111 for example. Furthermore, the sizes of excess material 525 and excess material 526 may be limited (e.g., excess material 525 and excess material 526 may not extend further laterally over lateral epitaxy overgrowths 107, 109) such that source and drain contacts (not shown) may not be shorted contacted by excess material 525 and excess material 526. The sizes of excess material 525 and excess material 526 may be limited for example by masking and etching steps (e.g., by removing portions of a bulk layer to leave only excess material 525 and excess material 526) or by applying the material of gate 106 to a patterned masked and utilizing a lift off technique to leave only excess material 525 and excess material 526 or the like. Furthermore, in some examples, excess material 525 and excess material 526 may remain in a final device structure. In other examples, such as examples discussed with respect to FIGS. 1 and 2, excess material 525 and excess material 526 may be removed.

Transistor structure 523 may include a transistor 524. As shown in FIG. 5J, transistor 524 may include a gate 106 that is aligned with opening 111 (e.g., a centerline of gate 106 is aligned with a centerline of opening 111 as discussed herein). Transistor 524 may be similar to transistor 100 as discussed herein with the exception that gate dielectric 105 may cover portions of lateral epitaxy overgrowths 107, 109 and additional portions of raised source 102 and raised drain 103 (please refer to FIG. 1). Furthermore, transistor structure 523 may include excess material 525 and excess material 526 as discussed. As shown in FIG. 1, in some examples, transistor structure 150 may not include excess materials analogous to excess material 525 and excess material 526. However, in some examples, transistor structure 150 may include such excess materials. Transistor 524 may include any features or materials as discussed with respect to FIG. 1 and such details will not be repeated for the sake of brevity and clarity of presentation.

Figure 5K:
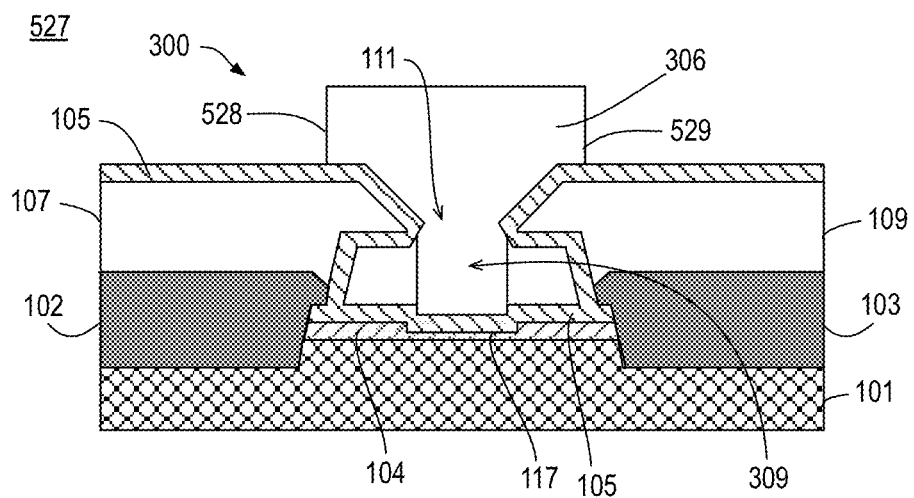

FIG. 5K illustrates a transistor structure 527 similar to transistor structure 522, after the formation of gate 306. Gate 306 may be formed using any suitable technique or techniques. In some examples, gate 306 may be a metal. For example, gate 306 may be formed via a deposition or sputter or the like. As discussed, in some examples, gate dielectric 105 may be a high-k material or materials and in such examples, the resultant transistor may be characterized as a high-k metal gate transistor. As shown, in some examples, the formation of gate 306 may also cause the formation of sidewalls 528, 529 such that gate 306 is patterned. Gate 306 may be patterned to include sidewalls 528, 529 using any suitable technique or techniques. For example, gate 306 by masking and etching steps (e.g., by removing portions of a bulk layer to leave only gate 306) or by applying the material of gate 306 to a patterned masked and utilizing a lift off technique to leave only gate 306 or the like.

As shown, transistor structure 527 may include transistor 300 as discussed above with respect to FIG. 3. As discussed, portion 309 of gate 306 adjacent to polarization layer 104 (please refer also to FIG. 3) may be aligned with opening 111. For example, lateral epitaxy overgrowth 107 and lateral epitaxy overgrowth 109 may be symmetrical with respect to a centerline of portion 309 of gate 306 and/or a centerline of gate recess 117 as discussed herein. In some embodiments, lateral epitaxy overgrowth 107 and lateral epitaxy overgrowth 109 may provide a symmetric mask for the formation of gate 306 and/or gate recess 117.

Subsequent processing may provide contacts to raised source 102 and raised drain 103, contact to gate 106 or gate 306, as well as metallization layers and the like. The illustrated gaps (not labeled) may be left as air gaps or they may be backfilled using dielectric material(s). Contacts to raised source 102 and raised drain 103 may be made via a patterned etch of lateral epitaxy overgrowth 107 and lateral epitaxy overgrowth 109 and metal fill for example. Contact to gate 106 and/or contact to gate 306 may be made via a dedicated landing pad (not shown) that may provide additional area for landing a gate contact. For example, from a top-down view gate 106 and or 306 may have a dog-bone shape. Such a configuration may be particularly advantage with respect to contacting gate 106.

The transistor structures and processes discussed herein may offer the advantage allowing the gate (e.g., gate 106 or gate 306) alignment tolerance to relax. Furthermore, gate resistance is reduced, which may be beneficial for achieve a high maximum frequency, $F_{MAX}$, and low noise without sacrificing the breakdown voltage of the transistor.

Figure 6:
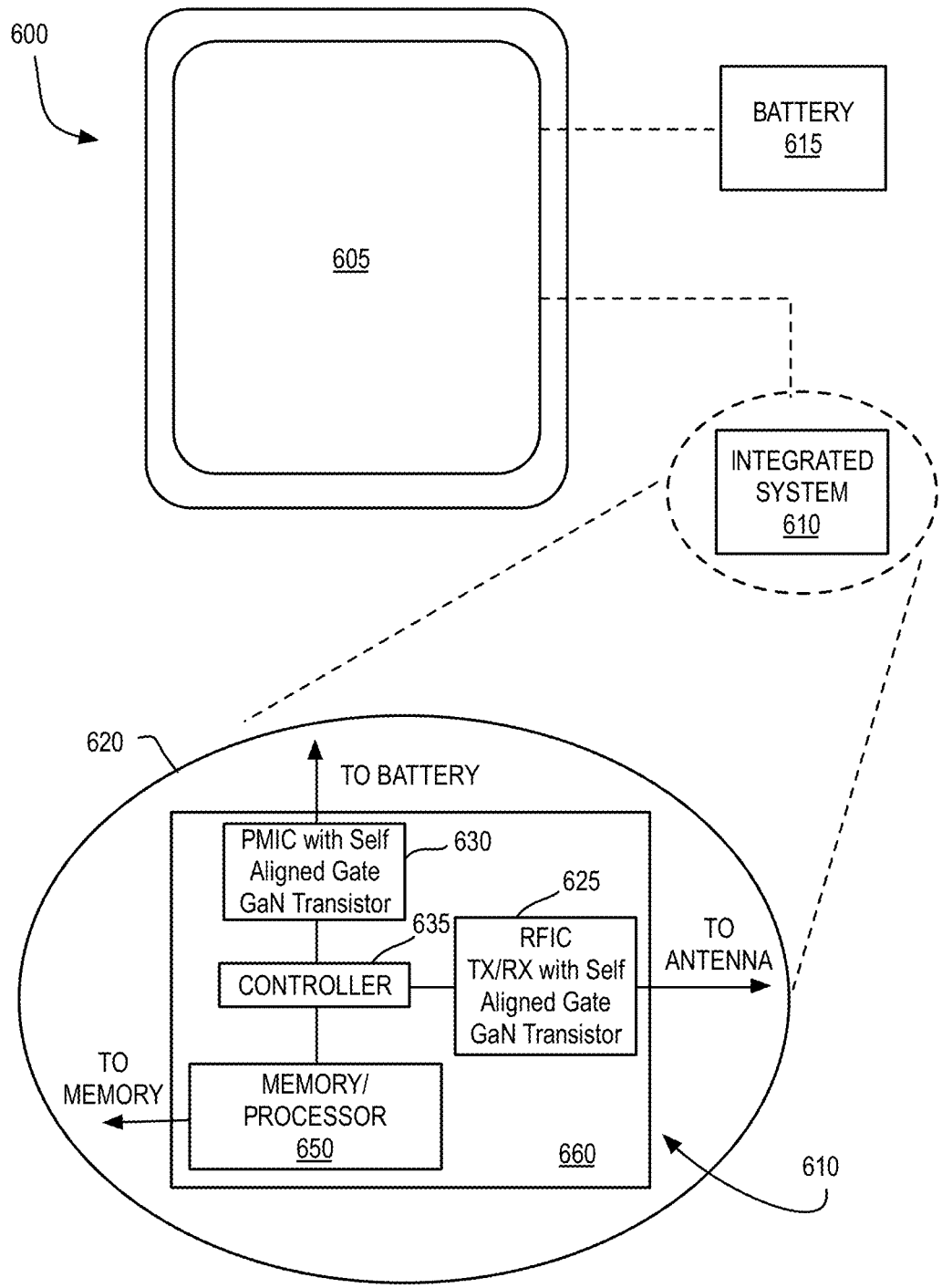
FIG. 6 is an illustrative diagram of a mobile computing platform employing an integrated circuit with transistor(s) having self aligned gates.

FIG. 6 is an illustrative diagram of a mobile computing platform 600 employing an IC with transistor(s) having self aligned gates, arranged in accordance with at least some implementations of the present disclosure. A transistor having a self aligned gate and/or self aligned gate recess may be any transistors as discussed herein such as transistor 100, transistor 200, transistor 300, or the like. Mobile computing platform 600 may be any portable device configured for each of electronic data display, electronic data processing, wireless electronic data transmission, or the like. For example, mobile computing platform 600 may be any of a tablet, a smart phone, a netbook, a notebook computer, a laptop computer, etc. and may include a display screen 605, which in the exemplary embodiment is a touchscreen (e.g., capacitive, inductive, resistive, etc. touchscreen), a chip-level (SoC) or package-level integrated system 610, and a battery 615.

Integrated system 610 is further illustrated in the expanded view 620. In the exemplary embodiment, packaged device 650 (labeled "Memory/Processor" in FIG. 6) includes at least one memory chip (e.g., RAM), and/or at least one processor chip (e.g., a microprocessor, a multi-core microprocessor, or graphics processor, or the like). In an embodiment, the package device 650 is a microprocessor including an SRAM cache memory. Packaged device 650 may be further coupled to (e.g., communicatively coupled to) a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller thereof 635. In general, packaged device 650 may be also be coupled to (e.g., communicatively coupled to) display screen 605. As shown, one or both of PMIC 630 and RFIC 625 may employ a transistor having a self aligned gate such as a self aligned gate GaN transistor. As shown, in some embodiments, a GaN transistor may be provided. However, the transistor may include any suitable material(s) and/or device layers such as III-N device layers or the like. For example, an transistor incorporated into a system (e.g., any platform, device, or system as discussed herein) may include a polarization layer disposed over a device layer, a raised source, a raised drain, and a gate between the raised source and the raised drain such that the polarization layer is between the raised source and the raised drain and such that the gate is disposed over the polarization layer, and/or a first lateral epitaxy overgrowth disposed over the raised source and having a first portion that extends laterally toward the gate and a second lateral epitaxy overgrowth over the raised drain and having a second portion that extends laterally toward the gate such that the first and second lateral overgrowths have an opening between the first and second portions and such that at least a portion of the gate adjacent to the polarization layer is aligned with the opening, or any other feature(s) as discussed herein.

Functionally, PMIC 630 may perform battery power regulation, DC-to-DC conversion, etc., and so has an input coupled to battery 615 and with an output providing a current supply to other functional modules. In an embodiment, PMIC 630 may perform high voltage operations. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 650 or within a single IC (SoC) coupled to the package substrate of the packaged device 650.

Figure 7:
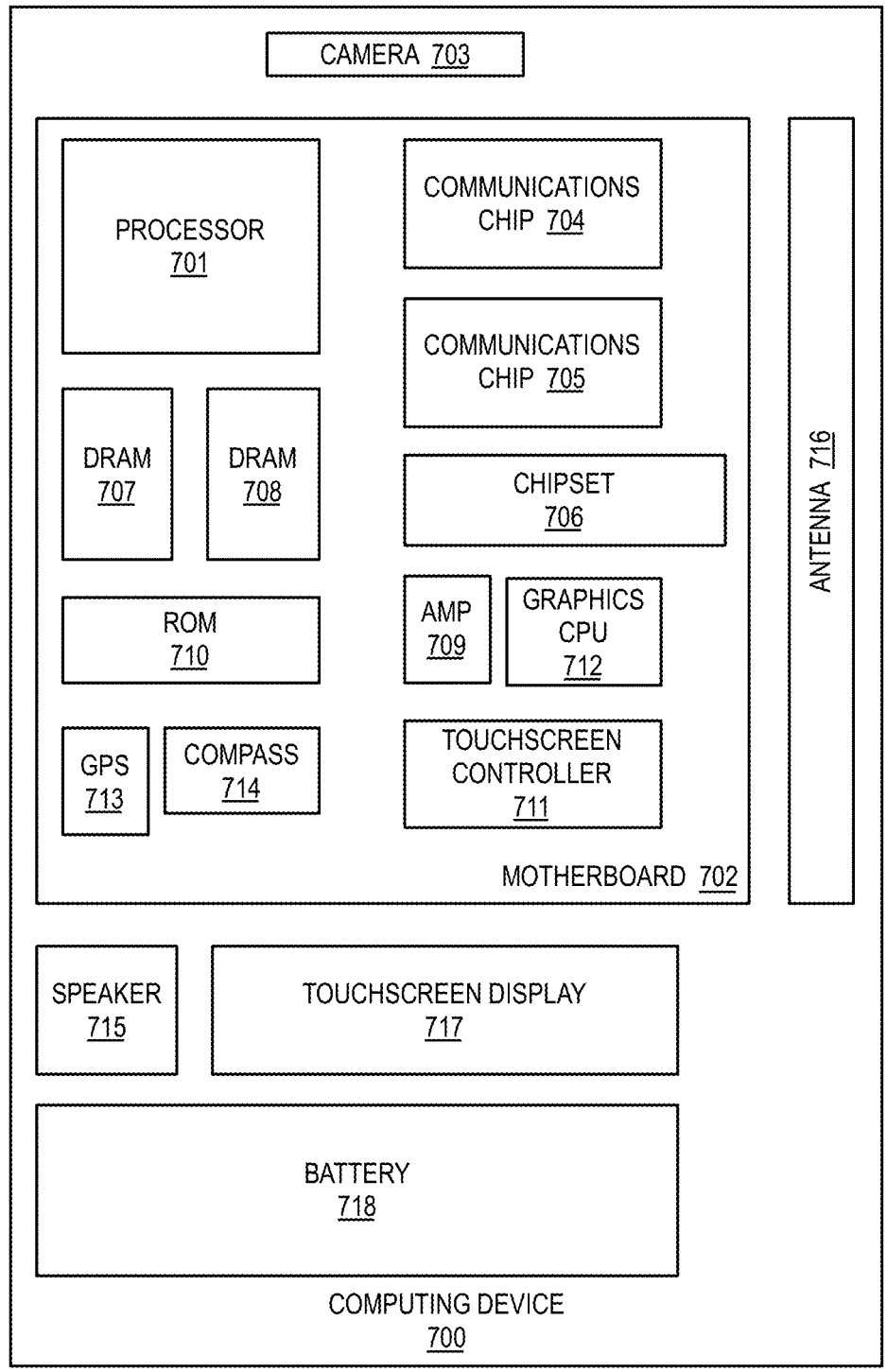
FIG. 7 is a functional block diagram of a computing device, all arranged in accordance with at least some implementations of the present disclosure.

FIG. 7 is a functional block diagram of a computing device 700, arranged in accordance with at least some implementations of the present disclosure. Computing device 700 may be found inside platform 600, for example, and further includes a motherboard 702 hosting a number of components, such as but not limited to a processor 701 (e.g., an applications processor) and one or more communications chips 704, 705. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 704, 705 may enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 704, 705 may implement any of a number of wireless standards or protocols, including but not limited to those described elsewhere herein. As discussed, computing device 700 may include a plurality of communication chips 704, 705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As discussed, the transistors discussed herein may be implemented via PMICs and/or RFICs such as in SoC implementations in computing devices. In other implementations, the transistors discussed herein may be implemented via base station wireless modules or systems, via power conversion modules in power transmission networks, via power conversion modules for electric vehicles, or the like.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a transistor comprises a polarization layer disposed over a device layer, a raised source, a raised drain, and a gate between the raised source and the raised drain, wherein the polarization layer is between the raised source and the raised drain and wherein the gate is disposed over the polarization layer, and a first lateral epitaxy overgrowth disposed over the raised source and having a first portion that extends laterally toward the gate and a second lateral epitaxy overgrowth over the raised drain and having a second portion that extends laterally toward the gate, wherein the first and second lateral overgrowths have an opening between the first and second portions, and wherein at least a portion of the gate adjacent to the polarization layer is aligned with the opening.

Further to the first embodiments, a top of the gate is below a top of the first lateral epitaxy overgrowth.

Further to the first embodiments, a top of the gate is below a top of the first lateral epitaxy overgrowth and the transistor further comprises a first gap between the gate and the first lateral epitaxy overgrowth and a second gap between the gate and second first lateral epitaxy overgrowth.

Further to the first embodiments, a top of the gate is below a top of the first lateral epitaxy overgrowth, and/or wherein the transistor further comprises a first gap between the gate and the first lateral epitaxy overgrowth and a second gap between the gate and second first lateral epitaxy overgrowth.

Further to the first embodiments, a second portion of the gate extends above and over a top of the first lateral epitaxy overgrowth.

Further to the first embodiments, the first lateral epitaxy overgrowth and the second lateral epitaxy overgrowth comprise a wide band gap semiconductor material.

Further to the first embodiments, a second portion of the gate extends above and over a top of the first lateral epitaxy overgrowth, and/or wherein the first lateral epitaxy overgrowth and the second lateral epitaxy overgrowth comprise a wide band gap semiconductor material.

Further to the first embodiments, the first lateral epitaxy overgrowth and the second lateral epitaxy overgrowth comprise at least one of gallium nitride or aluminum gallium nitride.

Further to the first embodiments, the transistor further comprises a gate dielectric between the polarization layer and the portion of the gate that is adjacent to the polarization layer.

Further to the first embodiments, the transistor further comprises a gate dielectric between the polarization layer and the portion of the gate that is adjacent to the polarization layer, wherein the gate dielectric extends over the polarization layer and at least a portion of the first lateral epitaxy overgrowth.

Further to the first embodiments, the polarization layer comprises a gate recess aligned with the opening.

Further to the first embodiments, a width of the portion of the gate adjacent to the polarization layer is not wider than a width of the opening.

Further to the first embodiments, the first lateral epitaxy overgrowth and the second lateral epitaxy overgrowth are symmetrical with respect to a centerline of the gate.

Further to the first embodiments, the device layer, the first lateral epitaxy overgrowth, and the second lateral epitaxy overgrowth comprise gallium nitride, the raised source and drain comprise indium gallium nitride, and the polarization layer comprises aluminum indium nitride.

In one or more second embodiments, a method for fabricating a transistor comprises disposing a polarization layer over a device layer, forming a raised source and a raised drain, wherein the polarization layer is between the raised source and the raised drain, forming a first lateral epitaxy overgrowth over the raised source and a second lateral epitaxy overgrowth over the raised drain, wherein the first and second lateral epitaxy overgrowths have an opening between a laterally extending first portion of the first lateral epitaxy overgrowth and laterally extending second portion of the second lateral epitaxy overgrowth, and disposing a gate between the raised source and the raised drain and over the polarization layer, wherein at least a portion of the gate adjacent to the polarization layer is aligned with the opening.

Further to the second embodiments, forming the first and second lateral epitaxy overgrowths comprises epitaxially growing the first lateral epitaxy overgrowth from the raised source over at least a first portion of a sacrificial patterned hardmask and epitaxially growing the second lateral epitaxy overgrowth from the raised drain over at least a second portion of the sacrificial patterned hardmask.

Further to the second embodiments, forming the first and second lateral epitaxy overgrowths comprises epitaxially growing the first lateral epitaxy overgrowth from the raised source over at least a first portion of a sacrificial patterned hardmask and epitaxially growing the second lateral epitaxy overgrowth from the raised drain over at least a second portion of the sacrificial patterned hardmask, wherein the sacrificial patterned hardmask comprises a hardmask stack including silicon nitride.

Further to the second embodiments, forming the first and second lateral epitaxy overgrowths comprises epitaxially growing the first lateral epitaxy overgrowth from the raised source over at least a first portion of a sacrificial patterned hardmask and epitaxially growing the second lateral epitaxy overgrowth from the raised drain over at least a second portion of the sacrificial patterned hardmask, wherein forming the sacrificial patterned hardmask comprises patterning a hardmask stack, and wherein forming the raised source and the raised drain comprises etching the device layer using the patterned hardmask to form trenches and epitaxially growing the raised source and the raised drain from the trenches.

Further to the second embodiments, forming the first and second lateral epitaxy overgrowths comprises epitaxially growing the first lateral epitaxy overgrowth from the raised source over at least a first portion of a sacrificial patterned hardmask and epitaxially growing the second lateral epitaxy overgrowth from the raised drain over at least a second portion of the sacrificial patterned hardmask, and/or wherein the sacrificial patterned hardmask comprises a hardmask stack including silicon nitride.

Further to the second embodiments, the method further comprises forming a gate recess in the polarization layer prior to forming the gate, wherein the opening provides a self aligning gate mask for forming the gate recess.

Further to the second embodiments, the method further comprises forming, prior to forming the gate, a gate dielectric over at least the polarization layer.

Further to the second embodiments, the method further comprises forming a gate recess in the polarization layer prior to forming the gate, wherein the opening provides a self aligning gate mask for forming the gate recess and/or forming, prior to forming the gate, a gate dielectric over at least the polarization layer.

Further to the second embodiments, forming the gate comprises forming a top of the gate below a top of the first lateral epitaxy overgrowth and providing a gap between the gate and the first lateral epitaxy overgrowth.

Further to the second embodiments, forming the gate comprises forming a second portion of the gate extending above and over at least part of the first portion of the first lateral epitaxy overgrowth.

Further to the second embodiments, forming the gate comprises forming a top of the gate below a top of the first lateral epitaxy overgrowth and providing a gap between the gate and the first lateral epitaxy overgrowth, or wherein forming the gate comprises forming a second portion of the gate extending above and over at least part of the first portion of the first lateral epitaxy overgrowth.

In one or more third embodiments, a system comprises a power management integrated circuit further comprising a transistor including a polarization layer disposed over a device layer, a raised source, a raised drain, and a gate between the raised source and the raised drain, wherein the polarization layer is between the raised source and the raised drain and wherein the gate is disposed over the polarization layer, and a first lateral epitaxy overgrowth disposed over the raised source and having a first portion that extends laterally toward the gate and a second lateral epitaxy overgrowth over the raised drain and having a second portion that extends laterally toward the gate, wherein the first and second lateral overgrowths have an opening between the first and second portions, and wherein at least a portion of the gate adjacent to the polarization layer is aligned with the opening.

Further to the third embodiments, a top of the gate is below a top of the first lateral epitaxy overgrowth and the transistor further comprises a first gap between the gate and the first lateral epitaxy overgrowth.

Further to the third embodiments, the gate has a second portion extending above and over at least part of the first portion of the first lateral epitaxy overgrowth.

Further to the third embodiments, the first lateral epitaxy overgrowth and the second lateral epitaxy overgrowth comprise a wide band gap semiconductor material.

Further to the third embodiments, the first lateral epitaxy overgrowth and the second lateral epitaxy overgrowth comprise at least one of gallium nitride or aluminum gallium nitride.

Further to the third embodiments, the transistor further comprises a gate dielectric between the polarization layer and the portion of the gate that is adjacent to the polarization layer, wherein the polarization layer comprises a gate recess aligned with the opening.

Further to the third embodiments, the transistor further comprises a gate dielectric between the polarization layer and the portion of the gate that is adjacent to the polarization layer, wherein the polarization layer comprises a gate recess aligned with the opening, wherein the gate dielectric extends over the polarization layer and at least a portion of the first lateral epitaxy overgrowth.

Further to the third embodiments, a width of the portion of the gate adjacent to the polarization layer is not wider than a width of the opening.

Further to the third embodiments, the first lateral epitaxy overgrowth and the second lateral epitaxy overgrowth are symmetrical with respect to a centerline of the gate.

Further to the third embodiments, the device layer, the first lateral epitaxy overgrowth, and the second lateral epitaxy overgrowth comprise gallium nitride, the raised source and drain comprise indium gallium nitride, and the polarization layer comprises aluminum indium nitride.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor comprising:
a polarization layer disposed over a device layer;
a raised source, a raised drain, and a gate between the raised source and the raised drain, wherein the polarization layer is between the raised source and the raised drain and wherein the gate is disposed over the polarization layer; and
a first lateral epitaxy overgrowth disposed over the raised source and having a first portion that extends laterally toward the gate and a second lateral epitaxy overgrowth over the raised drain and having a second portion that extends laterally toward the gate, wherein the first and second lateral overgrowths have an opening between the first and second portions, and wherein at least a portion of the gate adjacent to the polarization layer is aligned with the opening.

2. The transistor of claim 1, wherein a top of the gate is below a top of the first lateral epitaxy overgrowth.

3. The transistor of claim 2, further comprising:
a first gap between the gate and the first lateral epitaxy overgrowth and a second gap between the gate and second first lateral epitaxy overgrowth.

4. The transistor of claim 1, wherein a second portion of the gate extends above and over a top of the first lateral epitaxy overgrowth.

5. The transistor of claim 1, wherein the first lateral epitaxy overgrowth and the second lateral epitaxy overgrowth comprise a wide band gap semiconductor material.

6. The transistor of claim 1, wherein the first lateral epitaxy overgrowth and the second lateral epitaxy overgrowth comprise at least one of gallium nitride or aluminum gallium nitride.

7. The transistor of claim 1, further comprising:
a gate dielectric between the polarization layer and the portion of the gate that is adjacent to the polarization layer.

8. The transistor of claim 7, wherein the gate dielectric extends over the polarization layer and at least a portion of the first lateral epitaxy overgrowth.

9. The transistor of claim 1, wherein the polarization layer comprises a gate recess aligned with the opening.

10. The transistor of claim 1, wherein a width of the portion of the gate adjacent to the polarization layer is not wider than a width of the opening.

11. The transistor of claim 1, wherein the first lateral epitaxy overgrowth and the second lateral epitaxy overgrowth are symmetrical with respect to a centerline of the gate.

12. The transistor of claim 1, wherein the device layer, the first lateral epitaxy overgrowth, and the second lateral epitaxy overgrowth comprise gallium nitride, the raised source and drain comprise indium gallium nitride, and the polarization layer comprises aluminum indium nitride.

13. A method for fabricating a transistor comprising:
disposing a polarization layer over a device layer;
forming a raised source and a raised drain, wherein the polarization layer is between the raised source and the raised drain;
forming a first lateral epitaxy overgrowth over the raised source and a second lateral epitaxy overgrowth over the raised drain, wherein the first and second lateral epitaxy overgrowths have an opening between a laterally extending first portion of the first lateral epitaxy overgrowth and laterally extending second portion of the second lateral epitaxy overgrowth; and
disposing a gate between the raised source and the raised drain and over the polarization layer, wherein at least a portion of the gate adjacent to the polarization layer is aligned with the opening.

14. The method of claim 13, wherein forming the first and second lateral epitaxy overgrowths comprises:
epitaxially growing the first lateral epitaxy overgrowth from the raised source over at least a first portion of a sacrificial patterned hardmask and epitaxially growing the second lateral epitaxy overgrowth from the raised drain over at least a second portion of the sacrificial patterned hardmask.

15. The method of claim 14, wherein the sacrificial patterned hardmask comprises a hardmask stack including silicon nitride.

16. The method of claim 14, wherein forming the sacrificial patterned hardmask comprises patterning a hardmask stack, and wherein forming the raised source and the raised drain comprises etching the device layer using the patterned hardmask to form trenches and epitaxially growing the raised source and the raised drain from the trenches.

17. The method of claim 13, further comprising:
forming a gate recess in the polarization layer prior to forming the gate, wherein the opening provides a self aligning gate mask for forming the gate recess.

18. The method of claim 13, further comprising:
forming, prior to forming the gate, a gate dielectric over at least the polarization layer.

19. The method of claim 13, wherein forming the gate comprises forming a top of the gate below a top of the first lateral epitaxy overgrowth and providing a gap between the gate and the first lateral epitaxy overgrowth.

20. The method of claim 13, wherein forming the gate comprises forming a second portion of the gate extending above and over at least part of the first portion of the first lateral epitaxy overgrowth.

21. A system comprising:
a power management integrated circuit further comprising a transistor including:
a polarization layer disposed over a device layer;
a raised source, a raised drain, and a gate between the raised source and the raised drain, wherein the polarization layer is between the raised source and the raised drain and wherein the gate is disposed over the polarization layer; and
a first lateral epitaxy overgrowth disposed over the raised source and having a first portion that extends laterally toward the gate and a second lateral epitaxy overgrowth over the raised drain and having a second portion that extends laterally toward the gate, wherein the first and second lateral overgrowths have an opening between the first and second portions, and wherein at least a portion of the gate adjacent to the polarization layer is aligned with the opening.

22. The system of claim 21, wherein a top of the gate is below a top of the first lateral epitaxy overgrowth, the transistor further comprising:
a first gap between the gate and the first lateral epitaxy overgrowth.

23. The system of claim 21, wherein the gate has a second portion extending above and over at least part of the first portion of the first lateral epitaxy overgrowth.

24. The system of claim 21, the transistor further comprising:
a gate dielectric between the polarization layer and the portion of the gate that is adjacent to the polarization layer, wherein the polarization layer comprises a gate recess aligned with the opening.

25. The system of claim 21, wherein the device layer, the first lateral epitaxy overgrowth, and the second lateral epitaxy overgrowth comprise gallium nitride, the raised source and drain comprise indium gallium nitride, and the polarization layer comprises aluminum indium nitride.

* * * * *